(12) United States Patent
Bibler

(10) Patent No.: US 6,491,732 B1
(45) Date of Patent: *Dec. 10, 2002

(54) WAFER HANDLING APPARATUS AND METHOD

(75) Inventor: Adean Anne Bibler, Bethlehem, PA (US)

(73) Assignee: Agere Systems Inc., Allentown, PA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/749,719

(22) Filed: Nov. 15, 1996

(51) Int. Cl.[7] .......................... H01L 21/00; H01L 21/64
(52) U.S. Cl. ....................................... 29/25.01
(58) Field of Search .......................... 29/25.01; 414/940

(56) References Cited

U.S. PATENT DOCUMENTS

| | | | |
|---|---|---|---|
| 5,180,273 A | * | 1/1993 | Sakaya et al. |
| 5,366,079 A | | 11/1994 | Lin et al. .................. 206/328 |
| 5,551,571 A | | 9/1996 | Lin et al. .................. 206/710 |
| 5,553,711 A | | 9/1996 | Lin et al. .................. 206/710 |
| 5,611,448 A | * | 3/1997 | Chen |
| 5,630,690 A | * | 5/1997 | Salzman |

OTHER PUBLICATIONS

Patent Abstracts of Japan, Publication No. 09107015 A, application No. 08223149, filed Aug. 5, 1996.
Patent Abstracts of Japan, Publication No. 09104983 A, application No. 08223176, filed Aug. 5, 1996.
"A New Method For Enhaning Focus Latitude In Optical Lithography: FLEX", H. Fukuda et al., *IEEE Electron Device Letters*, vol. EDL–8, No. 4, Apr. 1987.
"Improvement Of Defocus Tolerance In A Half–Micron Optical Lithography By The Focus Latitude Enhancement Exposure Method: Simulation and Experiment," H. Fukuda et al., J. Vac. Sci. Technol., B7 (4), Jul./Aug. 1989.

* cited by examiner

Primary Examiner—David E. Graybill

(57) ABSTRACT

An insert arm holding and transporting wafers within a wafer jar is disclosed. The insert has a generally round bottom with a plurality of upward extending arms to closely hold and receive wafers which may be loaded either manually or mechanically.

4 Claims, 2 Drawing Sheets

WAFER HANDLING APPARATUS AND METHOD

TECHNICAL FIELD

This invention relates to methods and apparatus for handling semiconductor wafers.

BACKGROUND OF THE INVENTION

It is common during the manufacture of semiconductor integrated circuit chips to process semiconductor wafers with steps such as etching, deposition, etc., and then ship the processed wafers to a remote location for dicing and packaging. Wafers which are shipped to remote packaging operations are commonly packed manually in wafer jars. (A wafer jar is denoted by reference numeral 11 of FIG. 1.) When packing wafers into a wafer jar, an operator, may use a device termed "wafer dealer" to present the wafers to him one at a time. Alternatively, the operator may select wafers manually. Then the operator picks up each wafer, either with a vacuum wand or a gloved hand and places the wafer in the wafer jar. A paper disc is placed between each wafer. Typically, a wafer jar may hold 1–25 wafers. A lid is placed upon the wafer jar after it has been filled with wafers.

When the wafers arrive at the remote packaging location, the wafers are unpacked by removing the jar lid and turning the jar upside down on a table and emptying its contents upon the table. This process of emptying the jar presents both contamination and breakage hazards.

Those concerned with the advancement of semiconductor integrated circuit manufacturing technology have consistently sought better and more reliable methods of wafer handling. There exists wafer handling equipment which utilizes a vacuum wand to hold the wafer by suction on its backside. However, such a vacuum wand is not capable of safely loading a wafer jar because the wand would be required to drop the wafer into the jar from the top. Alternatively, operators use tweezers to grasp wafers by the edge. However, this method is unsuitable for loading a wafer jar.

SUMMARY OF THE INVENTION

Wafer handling may be facilitated by the present invention which illustratively, includes a wafer jar insert having a round base for supporting the wafers and at least one arm rigidly extending upward from the base.

In an illustrative embodiment, the invention comprehends a plurality of arms extending upward from the base. A plurality of wafers may rest upon the base and may be closely received by the arms.

Alternatively, another embodiment is a method of integrated circuit manufacturing including the placing of a plurality of wafers into a wafer jar insert and then the placing of the wafer jar insert into a wafer jar.

Further illustrative embodiments include opening the wafer jar; removing a wafer jar insert from the wafer jar; and removing at least one wafer from the wafer jar insert.

Another embodiment also includes an apparatus for the manufacture of integrated circuits including a wafer jar insert for holding wafers; a tube having a vacuum chuck adapted for holding a wafer face; and means for controlling empowering the tube whereby the tube places wafers within the wafer jar insert and then releases the wafers.

DETAILED DESCRIPTION

Figure 1:
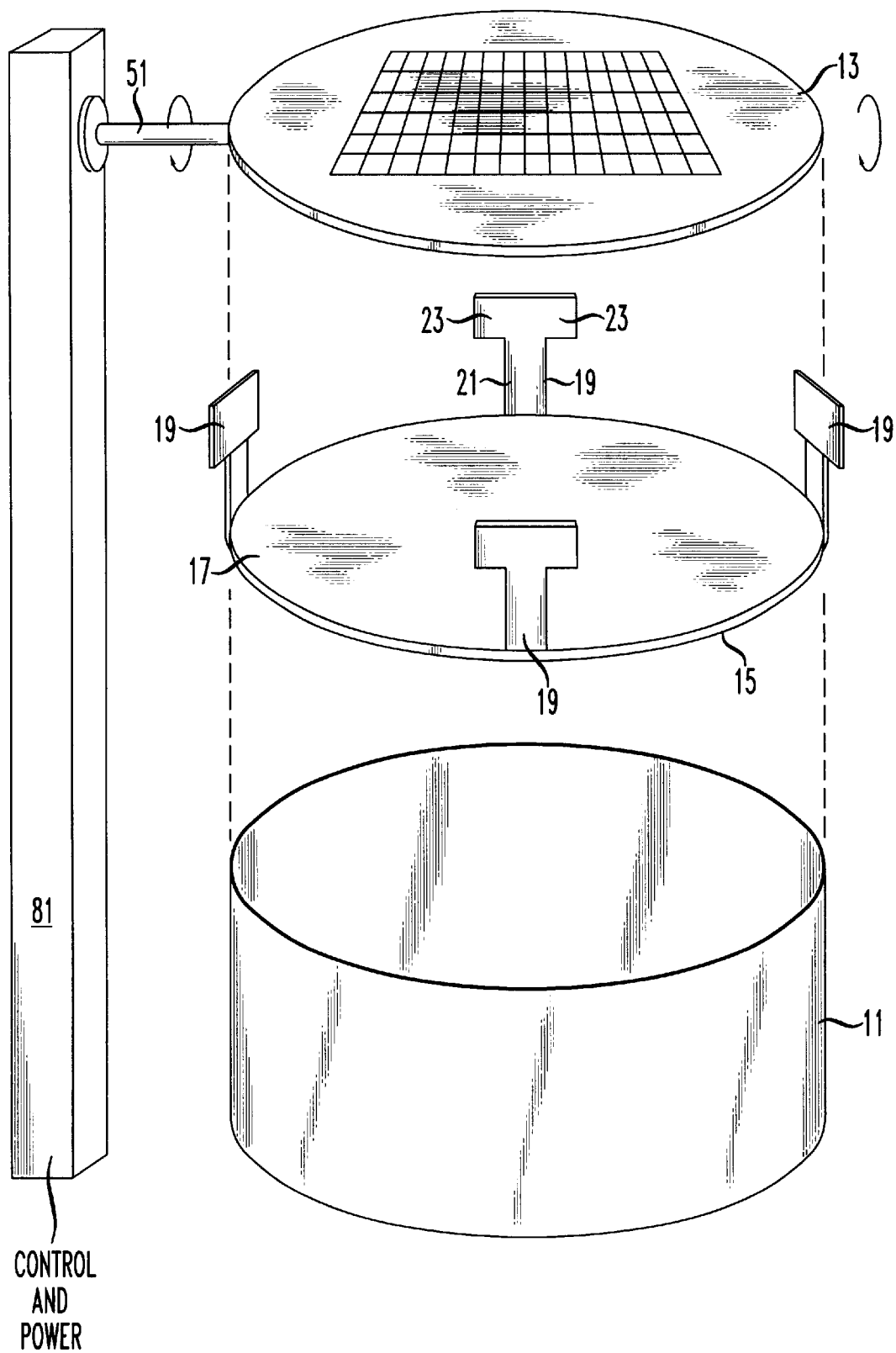
FIGS. 1 and 2 are perspective views of illustrative embodiments of the present invention.

Illustratively, the present invention encompasses a wafer jar insert; method of handling said insert; and method and apparatus for loading wafers into said insert. In FIG. 1, reference numeral 11 denotes a wafer jar commonly used in the semiconductor industry. For example, a representative wafer jar is model Wafercon 2100 manufactured by Semiconductor Products Inc., 724 Aldo Avenue, Santa Clara, Calif. 95054. Reference numeral 13 denotes a processed semiconductor wafer. It is desired to safely load (and subsequently unload) a plurality of wafers 13 into wafer jar 11. Illustratively, in the present invention, wafers 13 are first placed (either mechanically or by hand) into wafer jar insert 15. When wafer jar 15 is filled (or partially filled) with wafers, wafer jar insert 15 together with its wafer load is placed within wafer jar 11.

Wafer jar insert 15 has a generally flat round base 17. Indentations or cut-outs within base 17 are permissible. Extending upward from base 17 is a plurality of arms 19. There is no requirement for a precise number of arms. Only one arm would suffice if it were sufficiently rigidly attached to base 17. Three arms might be considered minimal in some circumstances to assure containment of wafers within wafer jar insert 15. The embodiment of FIG. 1 shows four arms 19. Each arm 19 has an upward extending portion 21 preferably rigidly attached to base 17. Portion 21 may exhibit a slight curvature consistent with its attachment to the round periphery of base 17. Ears 23 are (optionally) positioned atop upward extending portion 21 to facilitate manual or mechanical handling of the insert 15. Other features for facilitating mechanical handling, such as hooks or loops extending inward or outward may also be utilized.

In manual operation, a plurality of wafers 13 is loaded into wafer jar insert 15. Then wafer jar insert 15, with its accompanying wafer load is placed into wafer jar 11. A lid is placed upon wafer jar 11 and the jar is shipped to a remote location. When wafer jar 11 arrives its destination, the lid is removed, the wafer jar insert 15 is grabbed by ears 23 and removed from wafer jar 11 together with its wafer load. There is no risk of breakage or contamination of the individual wafers. Individual wafers may then be removed or inspected from wafer jar insert 15.

An alternative packing procedure might include: loading wafer jar insert 15 manually; inverting wafer jar 11 over loaded wafer jar insert 15; placing the lid of wafer jar 11 beneath the inverted wafer jar, and in contact with base 17. In this procedure, removal of wafer jar 15 and its load is accomplished by simply lifting wafer jar 11 up away from wafer jar insert 15 at the remote location.

Figure 2:
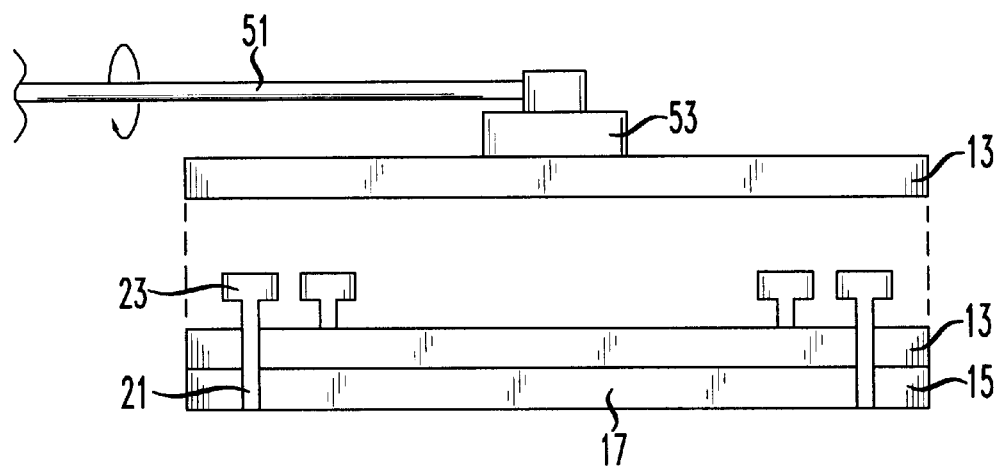

Wafer jar insert 15 is also ideally suited to machine loading and unloading. Shown in FIG. 2 is vacuum chuck 53 connected to tube 51. Vacuum chuck 53 grasps wafer 13 on its underside. Tube 51 rotates, thereby inverting wafer 13. Tube 51 then lowers wafer 13 into wafer jar insert 15. Tube 51 fits between upward extending portions 21 without interference. Thus, it can be seen that the use of wafer jar insert 15 permits mechanical loading of wafers 13 ultimately into wafer jar 11 which could not otherwise be accomplished. Unloading may be performed by simply reversing the above process. In other words, wafer jar insert 15, together with its wafer load is removed from wafer jar 11 and then a tube with a vacuum chuck unloads each wafer.

The same tube and vacuum chuck or an additional one might provide interleaved pieces of paper.

Tube 51 is controlled and powered by apparatus 81 easily designed by those of skill in the art.

Figure 3:
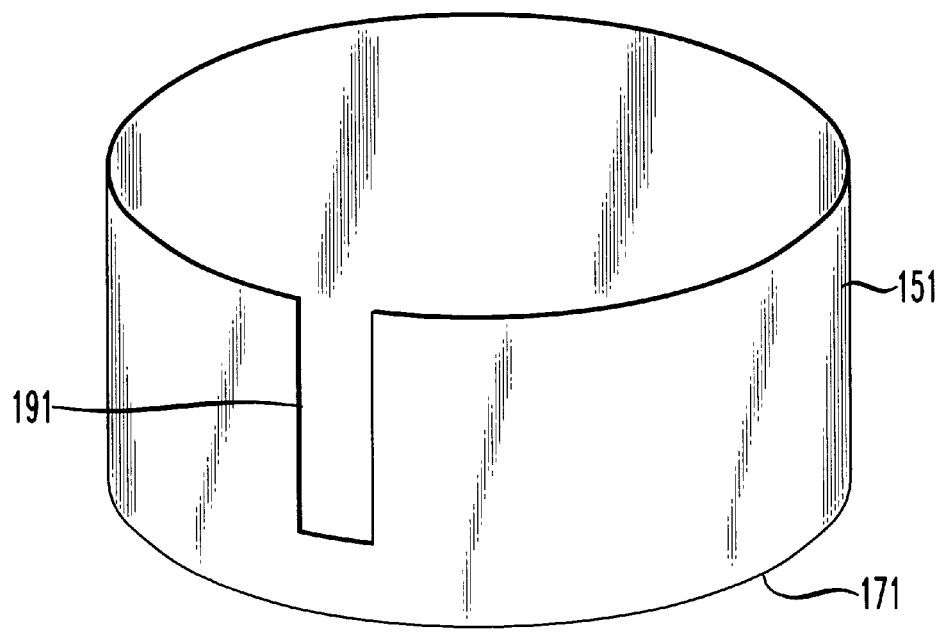
FIG. 3 is a perspective view of an alternative embodiment of the invention.

In FIG. 3, insert 151 has round base 171. One wraparound arm 151 extends upward from base 171 and encircles base 171. Opening 191 permits lowering of wafers by vacuum chuck 53 and tube 51.

The invention claimed is:

1. A method of manufacturing an integrated circuit, comprising:

providing a wafer jar insert having a plurality of vertical arms extending from a planar insert base thereof;

providing a wafer jar having a closed end and an open end, the closed end forming a wafer jar base;

placing at least one of said wafers into said wafer jar insert between said plurality of vertical arms; and placing said wafer jar insert into said wafer jar through said open end of said wafer jar so that the planar insert base is supported by and in direct physical contact with the wafer jar base and said plurality of vertical arms extend away from said wafer jar base.

2. The method of manufacturing an integrated circuit recited in claim 1 further comprising transporting said wafer jar.

3. The method of manufacturing an integrated circuit recited in claim 1 wherein said wafer jar is a cylindrical jar dimensioned to receive said wafer jar insert.

4. The method of manufacturing an integrated circuit recited in claim 1 wherein said wafer jar includes a side and said base and said side form a cavity, and said placing said wafer jar insert into said wafer jar includes placing said planar insert base inside said cavity.

* * * * *